(12) United States Patent
Kukita

(10) Patent No.: US 8,471,195 B2
(45) Date of Patent: Jun. 25, 2013

(54) PUSH BUTTON INCLUDING A PHOTOSENSOR

(75) Inventor: Noritoshi Kukita, Tokyo (JP)

(73) Assignees: Universal Entertainment Corporation, Tokyo (JP); Aruze Gaming America, Inc., Las Vegas, NV (US)

( * ) Notice: Subject to any disclaimer, the term of this patent is extended or adjusted under 35 U.S.C. 154(b) by 337 days.

(21) Appl. No.: 12/940,350

(22) Filed: Nov. 5, 2010

(65) Prior Publication Data

US 2011/0108403 A1    May 12, 2011

(30) Foreign Application Priority Data

Nov. 11, 2009   (JP) .................................. 2009-257745

(51) Int. Cl.
  *G01J 1/56*   (2006.01)
  *H01H 3/12*   (2006.01)
(52) U.S. Cl.
  USPC ..................................... 250/231.19; 200/341
(58) Field of Classification Search
  USPC .............................. 250/231.19, 221; 200/341
  See application file for complete search history.

(56) References Cited

U.S. PATENT DOCUMENTS 3,906,222 A * 9/1975 Astier et al. ................. 250/229
2005/0259073 A1* 11/2005 Hirano et al. ................. 345/157

FOREIGN PATENT DOCUMENTS

JP        2004-57380        2/2004

* cited by examiner

*Primary Examiner* — Thanh Luu
(74) *Attorney, Agent, or Firm* — Edwards Wildman Palmer LLP

(57) ABSTRACT

With respect to a push button, a part of a depressing portion is detected by a photo sensor when the depressing portion urged upward by a spring is depressed and stroke of the depressed depressing portion reaches a predetermined distance. Thereby, switch between OFF and ON is carried out. Also, the push button includes a metal dome. Load of the spring works on the depressing portion when depressed. Further, when the stroke of the depressed depressing portion reaches a predetermined distance so as to switch between OFF and ON, the load of the spring and that of the metal dome integrally work on the depressing portion.

1 Claim, 14 Drawing Sheets

BUTTON LAYOUT

PUSH BUTTON INCLUDING A PHOTOSENSOR

CROSS-REFERENCE TO RELATED APPLICATIONS

This application claims priority from JP 2009-257745, filed Nov. 11, 2009, the contents of which are hereby incorporated by reference.

BACKGROUND OF THE INVENTION

1. Field of the Invention

The present invention relates to a push button used in various fields, e.g., gaming machines such as slot machines, pachi-slot machines, pachinko machines (Japanese upright pinball gaming machines) etc., game controllers, keyboards for personal computers etc., mobile terminal devices, household electrical appliances, audio visual equipment, fixed-line phones, mobile phones, calculators, elevators, remote controllers etc.

2. Discussion of the Background

As an example of a push button, there has conventionally been known a push button that employs a photo sensor (e.g., refer to JP Laid-open patent application publication No. 2004-57380). In the above type push button, an output signal from a photo sensor is used for trigger switch between OFF and ON. Thereby, switch OFF and ON can be electrically carried out without mechanical contact.

In this connection, while the above such type push button was depressed for switch between OFF and ON, the balance between depression pressure needed for switch operation and reaction force against the pressure did not vary. This is because only the reaction force for returning the push button to its home position varies smoothly in accordance with the Hooke's law.

The present invention has been made to overcome the above mentioned problem and the object thereof is to provide a push button that uses an output signal from a photo sensor for trigger switch between OFF and ON wherein the balance between depression pressure needed for switch operation and reaction force against the pressure varies when switch between OFF and ON is carried out.

SUMMARY OF THE INVENTION

The present invention provides a push button having the following configuration. That is, the push button comprises: a depressing portion; an urging portion that urges the depressing portion in a first direction; a detection target portion that pokes out from the depressing portion in a second direction that is opposite to the first direction; a photo sensor that detects the detection target portion when the depressing portion is depressed in the second direction by a predetermined distance or longer; and an elastic portion that gets elastically deformed when the depressing portion is depressed in the second direction by the predetermined distance or longer.

According to the above mentioned push button, the depressing portion is urged in the first direction by the urging portion. In case the depressing portion is depressed in the second direction that is opposite to the first direction by the predetermined distance or longer, the detection target portion poking out from the depressing portion is detected by the photo sensor. Thus, the photo sensor outputs a signal concerning detection of the detection target portion. That is, an output signal from the photo sensor is used for trigger switch between OFF and ON. Further, in case the depressing portion is depressed by the predetermined distance or longer, the elastic portion is pushed against the depressing portion. In case the depressing portion is depressed by a distance shorter than the predetermined distance, only urging force of the urging portion works on the depressing portion. Thereby, balance relation between depression pressure needed for the switch operation and reaction force against the depression pressure is established. On the other hand, in case the depressing portion is depressed by the predetermined distance or longer, the urging force of the urging portion and elastic force of the elastic portion integrally work on the depressing portion, the balance relation between depression pressure needed for the switch operation and reaction force against the depression pressure varies.

In short, the push button directed to the present invention is a push button that uses an output signal from the photo sensor so as to trigger switch between OFF and ON. Particularly, the balance relation between depression pressure needed for the switch operation and reaction force against the depression pressure varies when switch between OFF and ON. Further, different from the background prior art, by the time the stroke of the depressed depressing portion reaches the bottommost point, switch between OFF and ON is carried out and the balance relation between depression pressure need for the switch operation and reaction force against the pressure varies. Accordingly, the above mechanism can obviate the situation that the depressing portion reaches the bottommost part. Thereby, there can be reduced deterioration and damage owing to that the depressing portion reaches the bottommost part.

BRIEF DESCRIPTIONS OF THE DRAWINGS

These and other objects and advantages of the present invention will be more fully apparent from the following detailed description taken in conjunction with the accompanying drawings, in which.

DESCRIPTION OF THE EMBODIMENT

<Characteristics of Present Invention>

Figure 1:
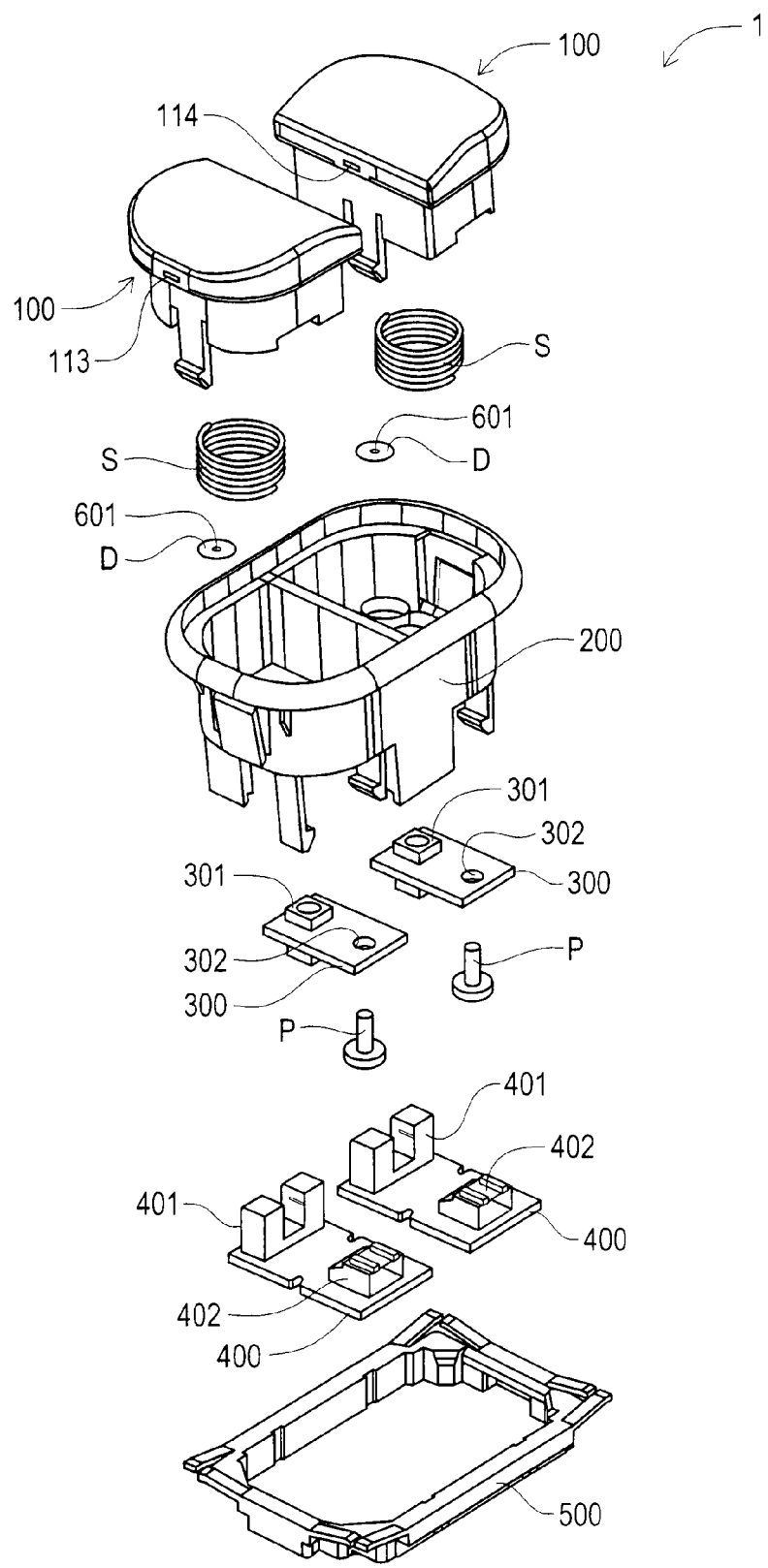
FIG. 1 is an exploded perspective view of a push button directed to an embodiment of the present invention.

Hereinafter, an embodiment of the present invention will be described in detail with reference to the drawings. FIG. 1 is an exploded perspective view of a push button 1 directed to an embodiment of the present invention.

Of the push button 1 directed to the present embodiment, a depressing portion 100 urged upward by a spring S is depressed by a player. When a stroke of the depressed depressing portion 100 further goes down to reach predetermined distance, a part of the depressing portion 100 is detected by a photo sensor 401. Thereby, switch between OFF and ON is carried out. Incidentally, the push button 1 of the present embodiment includes metal domes D.

In this regard, through the depressing portion 100, load of the spring S works on a finger of the player while he/she depresses the depressing portion 100. When a stroke of the depressed depressing portion 100 further goes down to reach the predetermined distance and switch between OFF and ON is carried out, load of the metal dome D works on the finger of the player via the depressing portion 100. Thereby, when the player depresses the depressing portion 100, the feeling of a click is given to the player at a moment of switch between OFF and ON.

Of the push button 1 directed to the present embodiment, the depressing portion 100 is formed of light guide resin that allows optical penetration of visible light and lit up with an LED 301. On the other hand, a part of the depressing portion 100 is formed of opaque resin that blocks visible light. The opaque part of the depressing portion 100 is a detection object for the photo sensor 401. Accordingly, even though the depressing portion 100 is lit up with the LED 301, the opaque part thereof can be detected by the photo sensor 401 at least on condition that the stroke of the depressed depressing portion 100 is at the predetermined distance. This is because the opaque part of the depressing portion 100 blocks visible light. Thereby, the OFF-ON switch function by the photo sensor 401 can be implemented.

<Arrangement Example of Present Invention>

Figure 13:
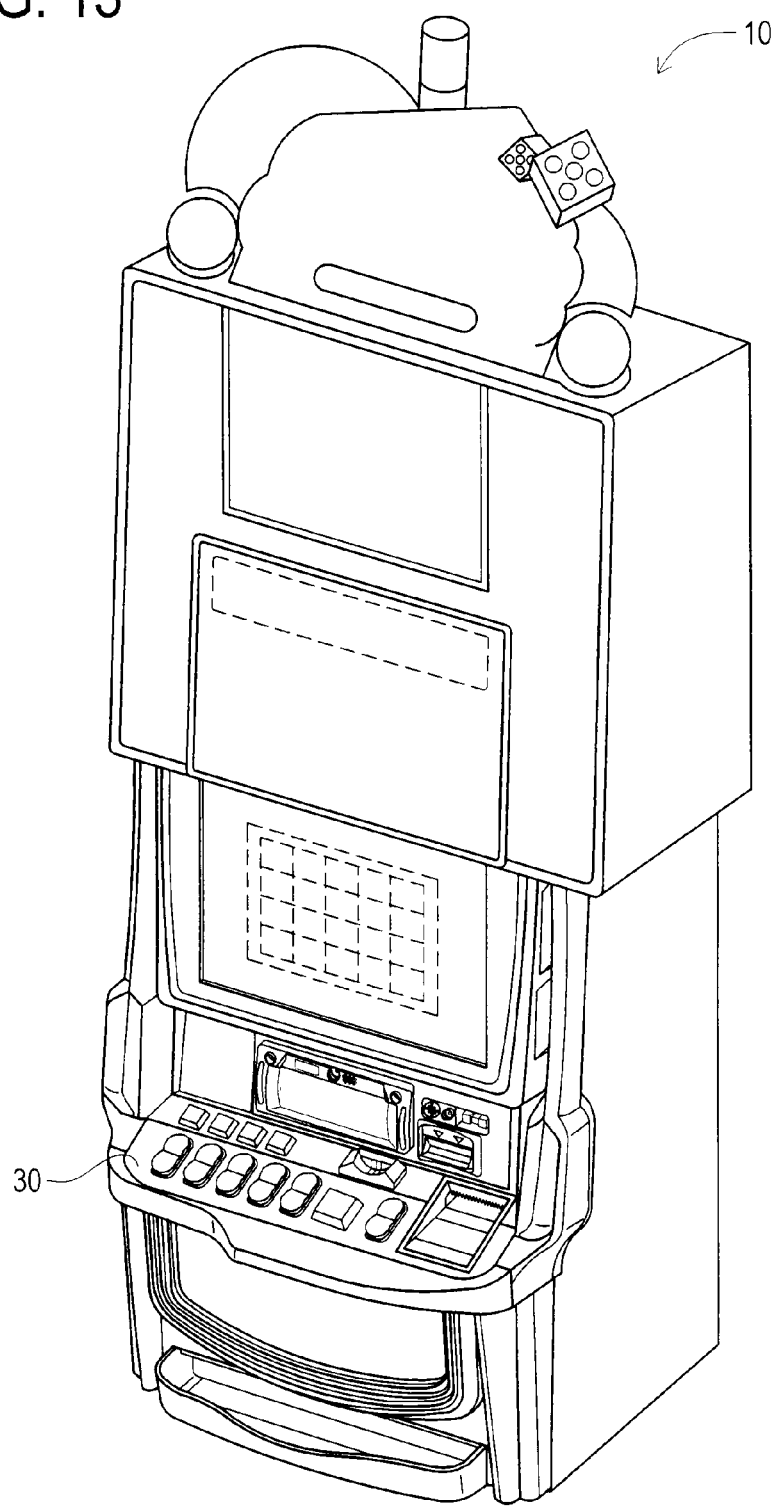
FIG. 13 is a perspective view of a slot machine that employs the push buttons.

There will be descried on arrangement example of push buttons 1 directed to the present invention. FIG. 13 is a perspective view of a slot machine 10 that employs the push buttons 1 directed to the present invention. As shown in FIG. 13, a control panel 30 is installed in the slot machine 10. Various buttons such as push buttons 1 of the present embodiment are arranged in the control panel 30.

Figure 14:
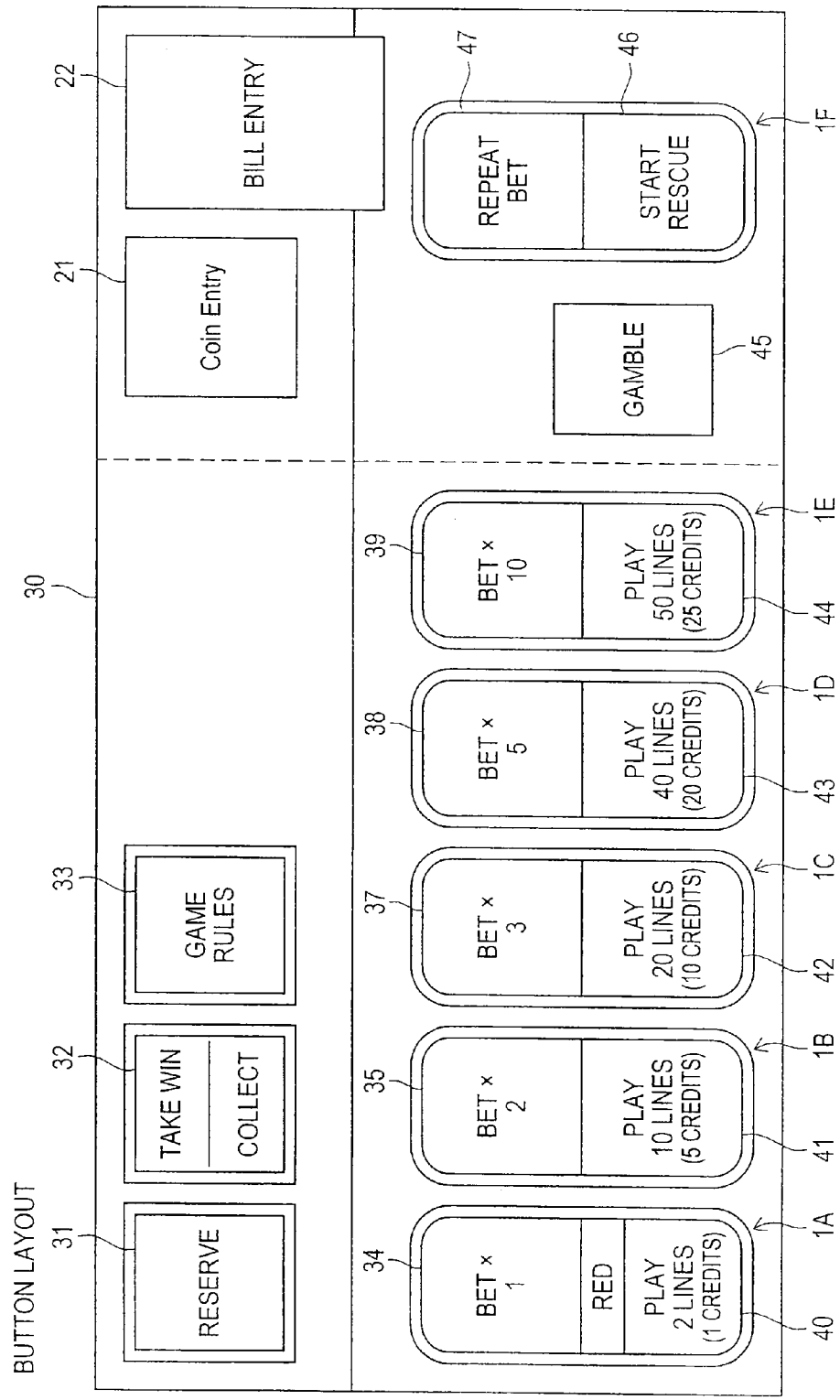
FIG. 14 is a front view of a control panel installed in the slot machine that employs the push buttons.

FIG. 14 is a front view of the control panel 30 installed in the slot machine 10 that employs the push buttons 1 of the present embodiment. In the control panel 30, there are arranged a coin slot 21, a bill slot 22 as well as push buttons 31-35, 37-47 for inputting various commands. In this regard, a pair of push buttons 34 and 40 adjoin to each other so as to integrally make up a two-way type push button 1A of the present embodiment. Hereinafter, pairs of push buttons 35 and 41, push buttons 37 and 42, push buttons 38 and 43, push buttons 39 and 44 and push buttons 46 and 47 similarly adjoin to each other so as to integrally make up two-way type push buttons 1B, 1C, 1D, 1E and 1F, respectively.

<Schematic Configuration of Present Invention>

Figure 2:
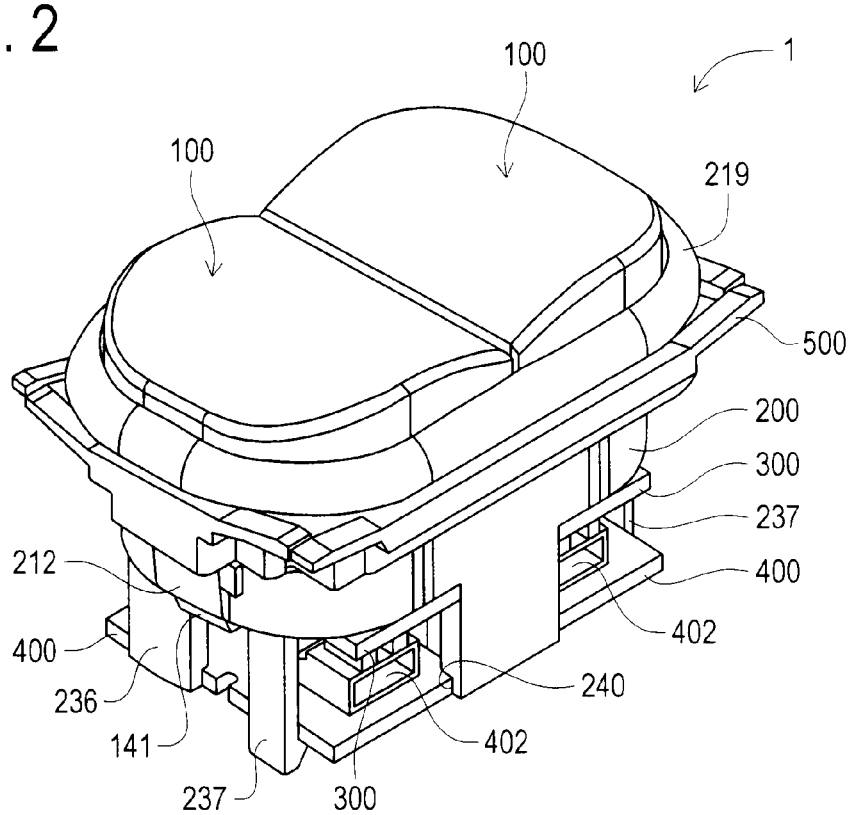
FIG. 2 is a perspective view of the push button when seen from top side.
Figure 3:
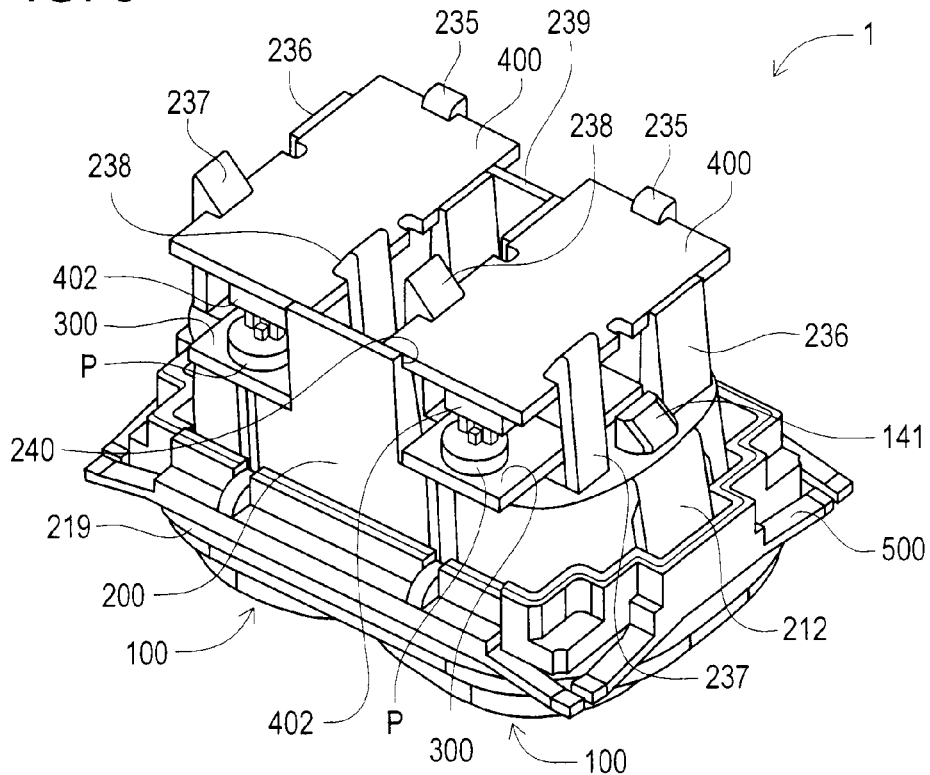
FIG. 3 is a perspective view of the push button when seen from bottom side.

A schematic configuration of the push button 1 directed to the present invention will be described with reference to FIGS. 2 and 3 in addition to FIG. 1 described above. FIG. 2 is a perspective view of the push button 1 directed to the present embodiment when seen from top side. FIG. 3 is a perspective view of the push button 1 directed to the present embodiment when seen from bottom side. As already described, the push button 1 directed to the present embodiment is a two-way type push button wherein adjoining two push buttons are integrated. Accordingly, the push button 1 includes various pairs of components. Except the case that specific explanation is required, one of each pair of components will be described hereinafter, since paired components are configured to be the same to each other.

As shown in FIG. 1, the push button 1 directed to the present embodiment consists of a pair of depressing portions 100, a pair of springs S, a pair of metal domes D, a button base 200, a pair of first mounting substrates 300, a pair of fitting screws P, a pair of second mounting substrates 400, a button frame 500 etc.

The depressing portion 100 is a portion to be depressed by a player. The numerical signs 113 and 114 indicate a first engagement opening and a second engagement opening, respectively. The first engagement opening 113 and the second engagement opening 114 are formed in each one of paired depressing portions 100.

The spring S for urging the depressing portion 100 upward is placed between the depressing portion 100 and the button base 200. The arrangement manner of those will be described later.

The metal dome D is a metallic round plate with a gradual dome-like shape and placed on the button base 200. The arrangement manner of those will be described later. It is to be noted that the metal dome D is placed with its dome-like part upside. A round concave portion 601 is formed at a center of the metal dome D placed with its dome-like part upside.

As already described, a pair of springs S and a pair of metal domes D are placed on the button base 200. The arrangement manner of those will be described later. As shown in FIGS. 2 and 3, the button base 200 houses a pair of depressing portions 100. The housing manner of those will be described later. As shown in FIGS. 2 and 3, a pair of first mounting substrates 300, a pair of fitting screws P, a pair of second mounting substrates 400, the button frame 500 etc. are mounted to the button base 200. The mounting manner of those will be described later.

The LED 301 is mounted on the first mounting substrate 300. The LED 301 is a three-color system light-emitting diode. Specifically, white light emission is controlled for the LED 301. Instead of white light, emission of another colored light may be controlled for the LED 301. Instead of three-color system, mono-color system light-emitting diode may be applied to the LED 301. Further, in place of the LED 301, other lighting member such as lamp may be used. It is to be noted that the LED 301 is mounted on one side of the first mounting substrate 300 and a connector is mounted on the other side thereof. A fitting hole 302 is formed in the first mounting substrate 300.

A fitting screw P is firstly inserted in the fitting hole 302 of the first mounting substrate 300 and coupled to the button base 200. Thus, the first mounting substrate 300 is attached to the button base 200 with the fitting screw P. The attachment manner of those will be described later.

The photo sensor 401 is mounted on the second mounting substrate 400. The photo sensor 401 includes an infrared emission diode as light emitting element. The photo sensor 401, however, may employ a light emitting element that emits light other than infrared light. Further, a spacer 402 is fixed to the second mounting substrate 400.

<Configuration of Depressing Portion>

Figure 4:
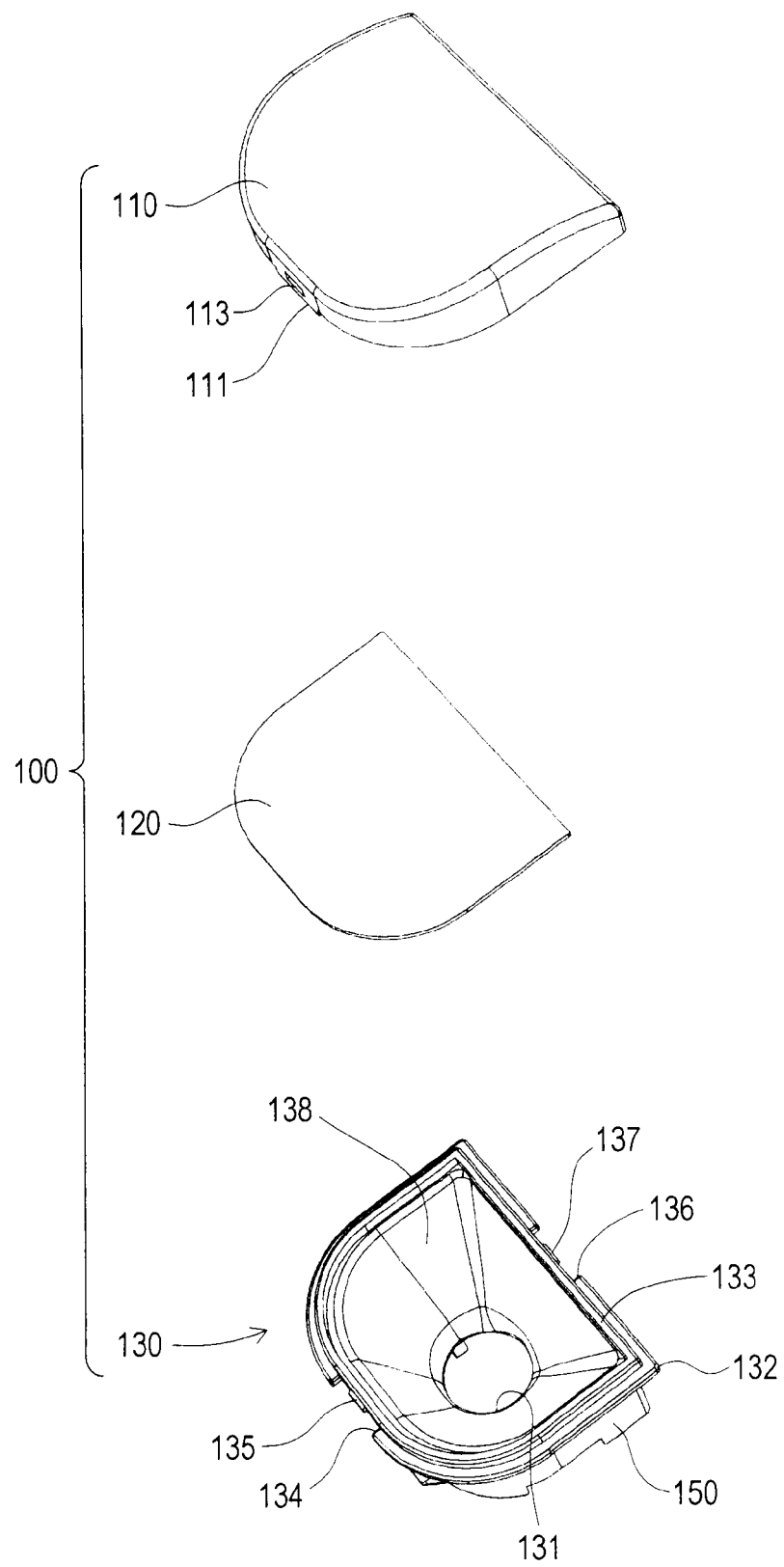
FIG. 4 is an exploded perspective view of a depressing portion constituting the push button when seen from top side.
Figure 5:
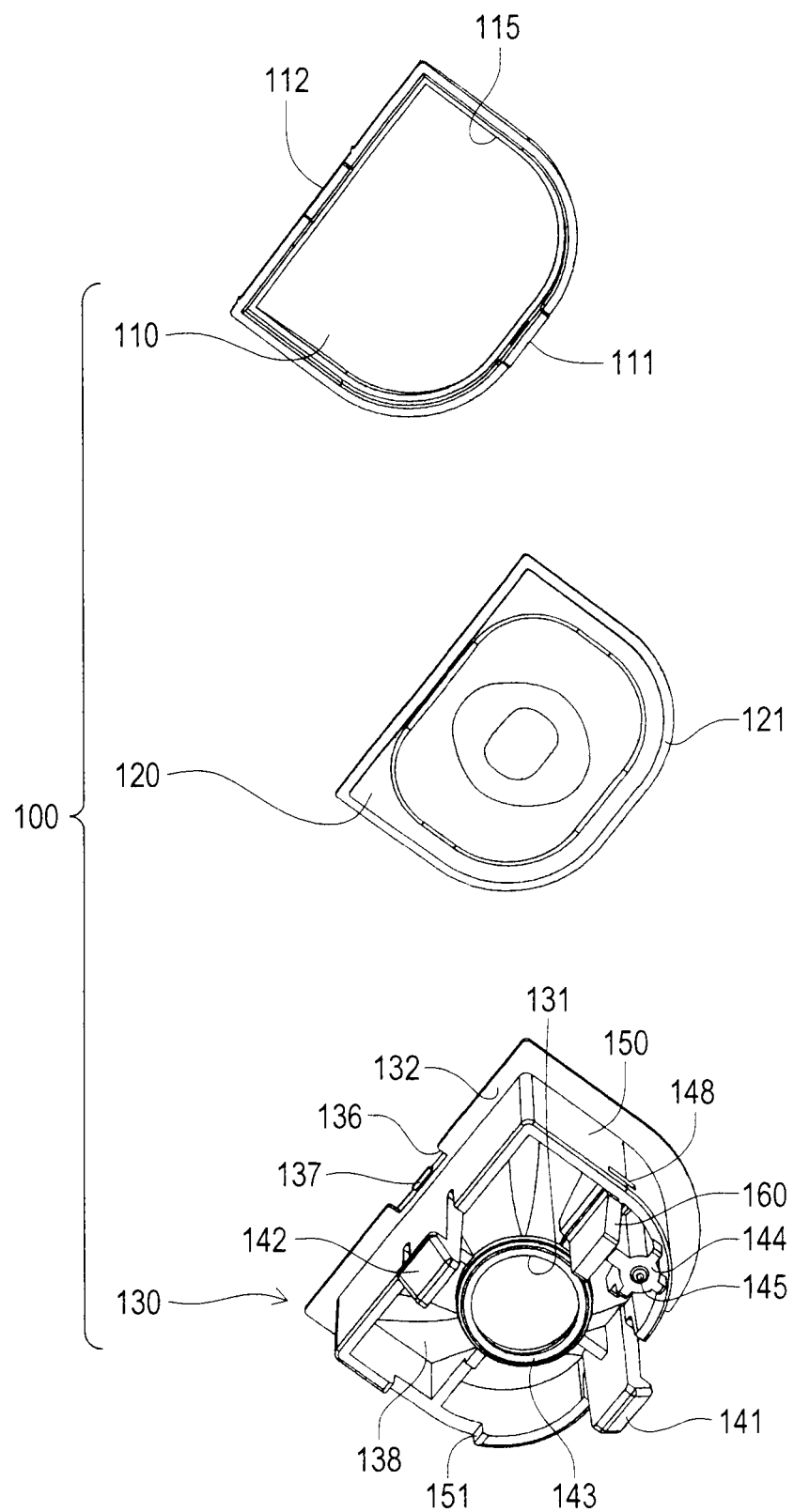
FIG. 5 is an exploded perspective view of the depressing portion constituting the push button when seen from bottom side.

The schematic configuration of the depressing portion 100 will be described with reference to FIGS. 4 and 5. FIG. 4 is an exploded perspective view of the depressing portion 100 when seen from top side. FIG. 5 is another exploded perspective view of the depressing portion 100 constituting the push button when seen from bottom side. As shown in FIGS. 4 and 5, the depressing portion 100 consists of an outside cover 110, an inner cover 120 and a head 130 etc.

The outside cover 110 is formed of resin that allows optical penetration of visible light. As shown in FIG. 5, a projecting rim 115 is formed on the inner surface of the outside cover 110. Further, a first projecting piece 111 and a second projecting piece 112 are formed so as to face each other at edges on the inner surface of the outside cover 110. A first engagement opening 113 is formed in the first projecting piece 111 (refer to FIGS. 1 and 4 described above). A second engagement opening 114 is formed in the second projecting piece 112 (refer to FIG. 1 described above).

The inner cover 120 is formed of resin that allows optical penetration of visible light. As shown in FIG. 5, a stepwise portion 121 is formed around the periphery on the inner surface of the inner cover 120.

The head 130 is formed of resin that allows optical penetration of visible light. As shown in FIG. 4, a round hole 131 is formed at the bottom center of a head base 150. The entirety of the top side for the head base 150 constitutes an opening portion of the head 130. Of the head 130, the inner surface portion extending from the opening portion to the round hole 131 defines a conic portion 138.

A projecting brim 132 and a projecting rim 133 are formed around the opening portion of the head 130, the opening portion corresponding to the entirety of the top side for the head base 150. A first cutout portion 134 and a second cutout portion 136 are formed so as to face each other at peripheral edges of the opening portion. A first engagement portion 135 and a second engagement portion 137 are formed on the first cutout portion 134 and the second cutout portion 136, respectively.

By fitting the inner cover 120 to the projecting rim 133 of the head 130 at the inner side thereof, the inner cover 120 is attached to the head 130. At this stage, the stepwise portion 121 (refer to FIG. 5) of the inner cover 120 gets fitted with the upper-end peripheral portion of the conic portion 138 of the head 130.

Thereafter, by fitting the projecting rim 115 of the outside cover 110 to the projecting rim 133 of the head 130 at the outer side thereof, the outside cover 110 is attached to the head 130. At this stage, the first projecting piece 111 of the outside cover 110 is fitted with the first cutout portion 134 of the head 130. At the same time, the first engagement portion 135 of the head 130 gets engaged with the first engagement opening 113 of the outside cover 110. Further, at this stage, the second projecting piece 112 of the outside cover 110 is fitted with the second cutout portion 136 of the head 130. At the same time, the second engagement portion 137 of the head 130 gets engaged with the second engagement opening 114 (refer to FIG. 1 described above) of the outside cover 110.

On the other hand, as shown in FIG. 5, at the bottom side of the head 130, a round projecting brim 143 is formed around the peripheral edge of the round hole 131. The upper end of the spring S (refer to FIG. 1 described above) gets fitted with the round projecting brim 143. A first hook portion 141 and a second hook portion 142 are formed so as to face each other at peripheral edges on the bottom side of the head base 150. Further, a third cutout portion 151 is formed near the peripheral edges on the bottom side of the head base 150.

Further, at the bottom side of the head 130, a protruding portion 144 is formed on the conic portion 138. The protruding portion 144 is configured to be cylindrical and reinforced with four ribs. A round convex portion 145 is formed at the center of the front end of the protruding portion 144. At the bottom side of the head 130, a detection target piece 160 is attached to the conic portion 138. In one of side surfaces of the head base 150, there is formed an engagement opening 148 that gets engaged with the detection target piece 160. It is to be noted that the detection target piece 160 is formed of resin that does not allow optical penetration of visible light.

Figure 6:
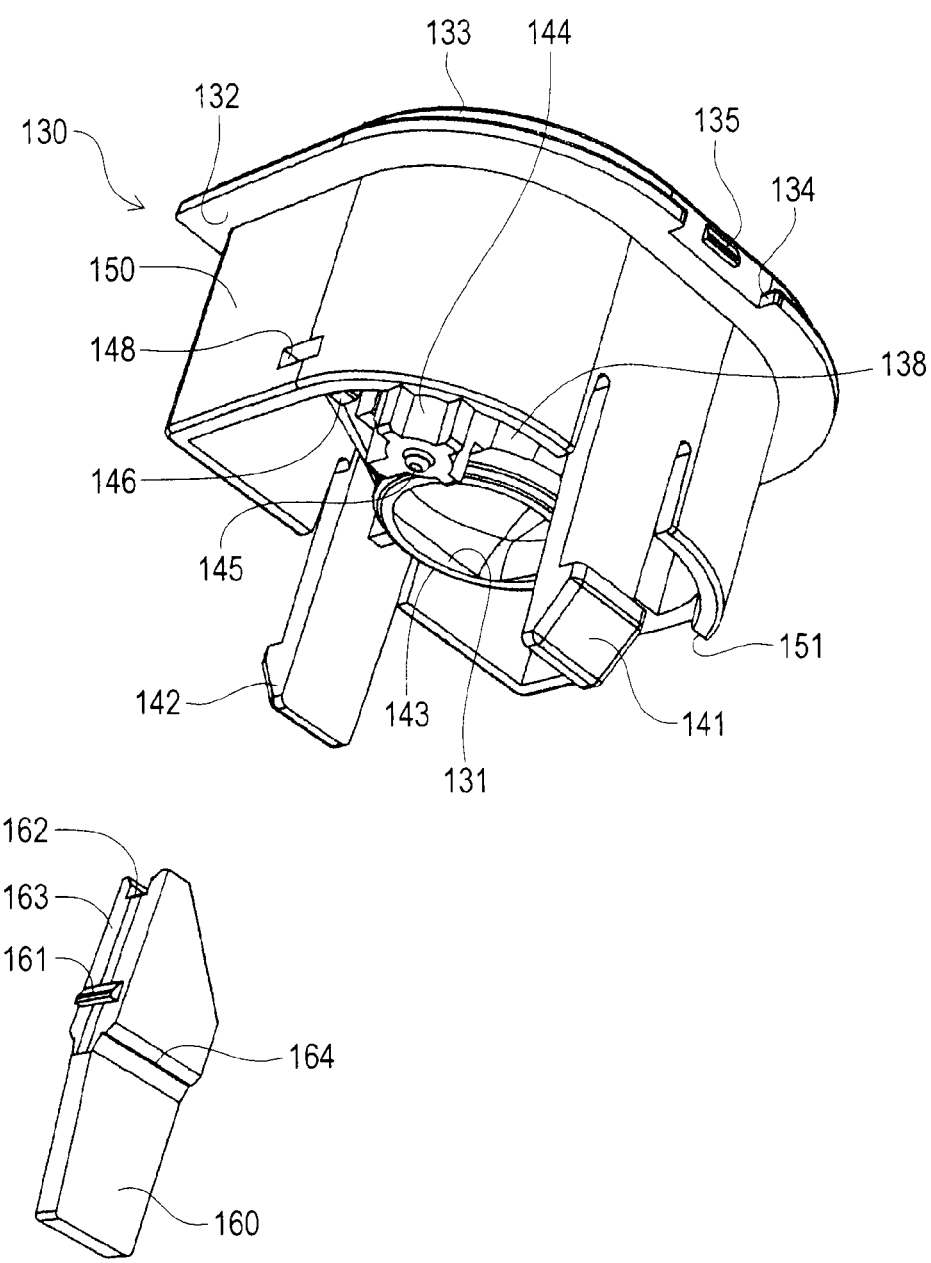
FIG. 6 is a perspective view of a head and a detection target piece both constituting the push button when seen from bottom side.
Figure 7:
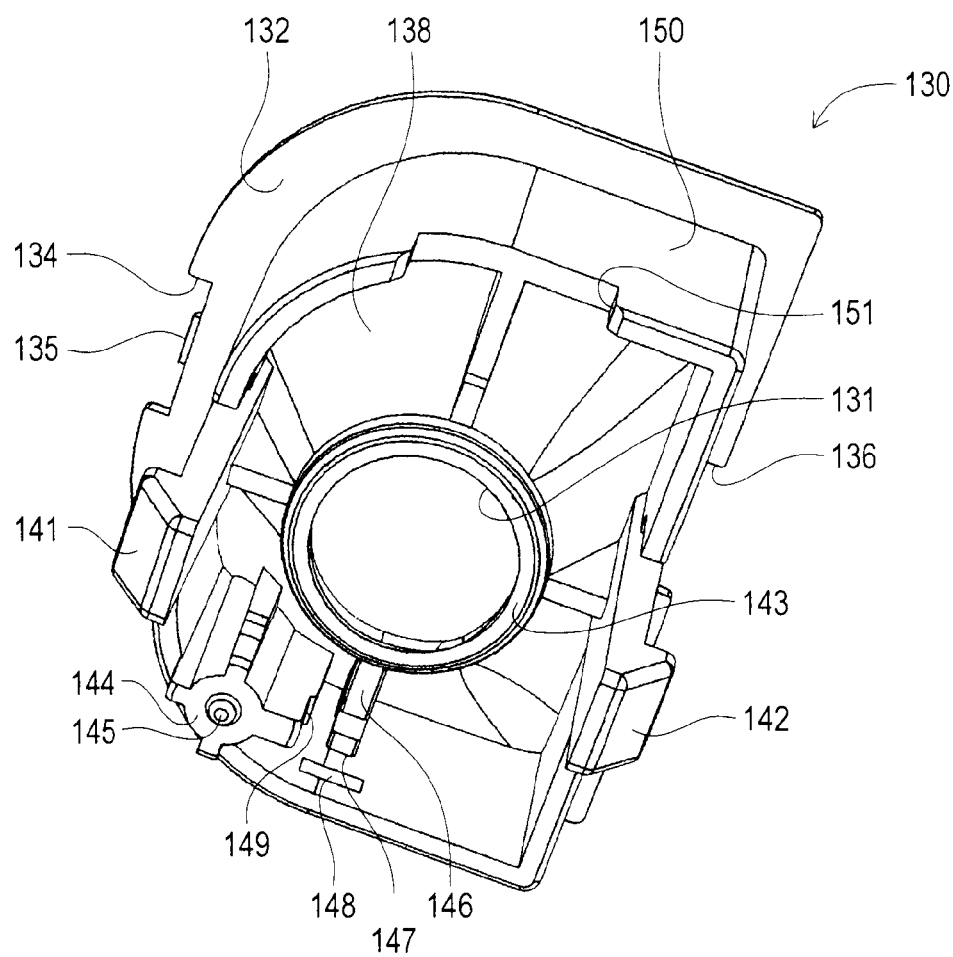
FIG. 7 is another perspective view of the head and the detection target piece both constituting the push button when seen from bottom side.

FIG. 6 and FIG. 7 each show a perspective view of the head 130 and the detection target piece 160 when seen from bottom side. As shown in FIGS. 6 and 7, at the bottom side of the head 130, a rib 146 is formed between the round projecting brim 143 and the engagement opening 148. The rib 146 is configured to include a fourth cutout portion 147. As shown in FIG. 7, a rib of the protruding portion 144 is configured to include a fifth cutout portion 149. On the other hand, the detection target piece 160 has a thin and flat plate-like shape. A part of the detection target piece 160 is formed slantwise. The detection target piece 160 is configured to include a stepwise portion 164 at the middle part with respect to its longer side direction. The detection target piece 160 is also configured to include an engagement portion 161 on an edge face 163 with respect to its shorter side. The detection target piece 160 is also configured to include a groove portion 162 that goes straight from an edge face when seen from longer side direction and down along a slantwise surface so as to reach a location near the stepwise portion 164 (refer to FIG. 10 described later).

The detection target piece 160 is attached to the bottom side of the head 130 by taking the below steps (1) through (4). It is to be noted that the order of those steps can be determined arbitrarily.

(1) The edge face 163 of the detection target piece 160, which included the engagement portion 161, shall get fitted to the fourth cutout portion 147 of the rib 146 of the head 130.

(2) The groove portion 162 of the detection target piece 160 shall get fitted to the rib 146 of the head 130.

(3) At one of ends of the groove portion 162, the detection target piece 160 shall get in contact with the fifth cutout portion 149 formed in the protruding portion 144 of the head 130.

(4) The engagement portion 161 of the detection target piece 160 shall get engaged with the engagement opening 148 of the head 130.

It is to be noted that the slantwise surface of the detection target piece 160 gets in contact with the conic portion 138 when the detection target piece 160 is attached to the head 130 at the bottom side thereof.

<Configuration of Button Base>

Figure 8:
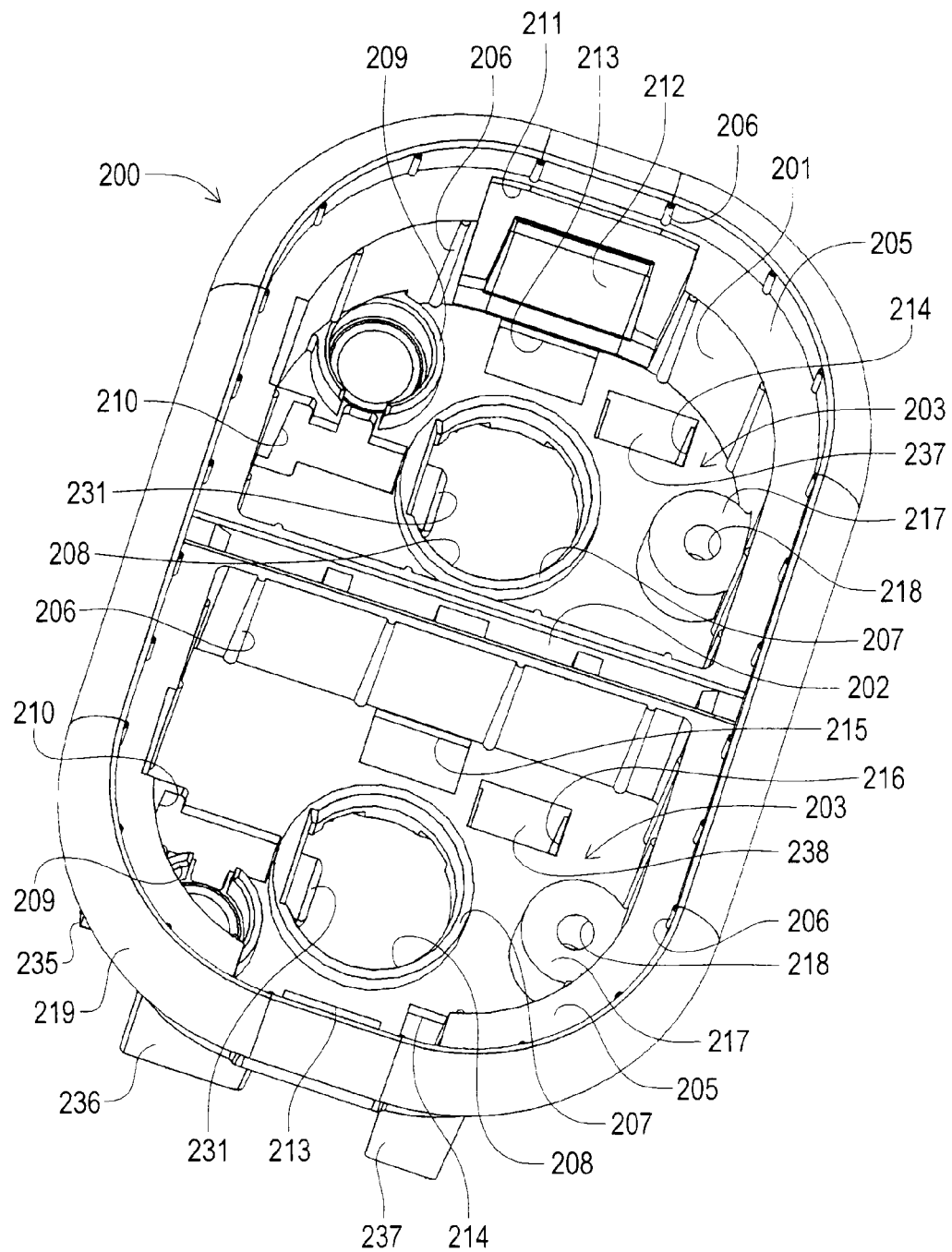
FIG. 8 is a perspective view of a button base constituting the push button when seen from top side.
Figure 9:
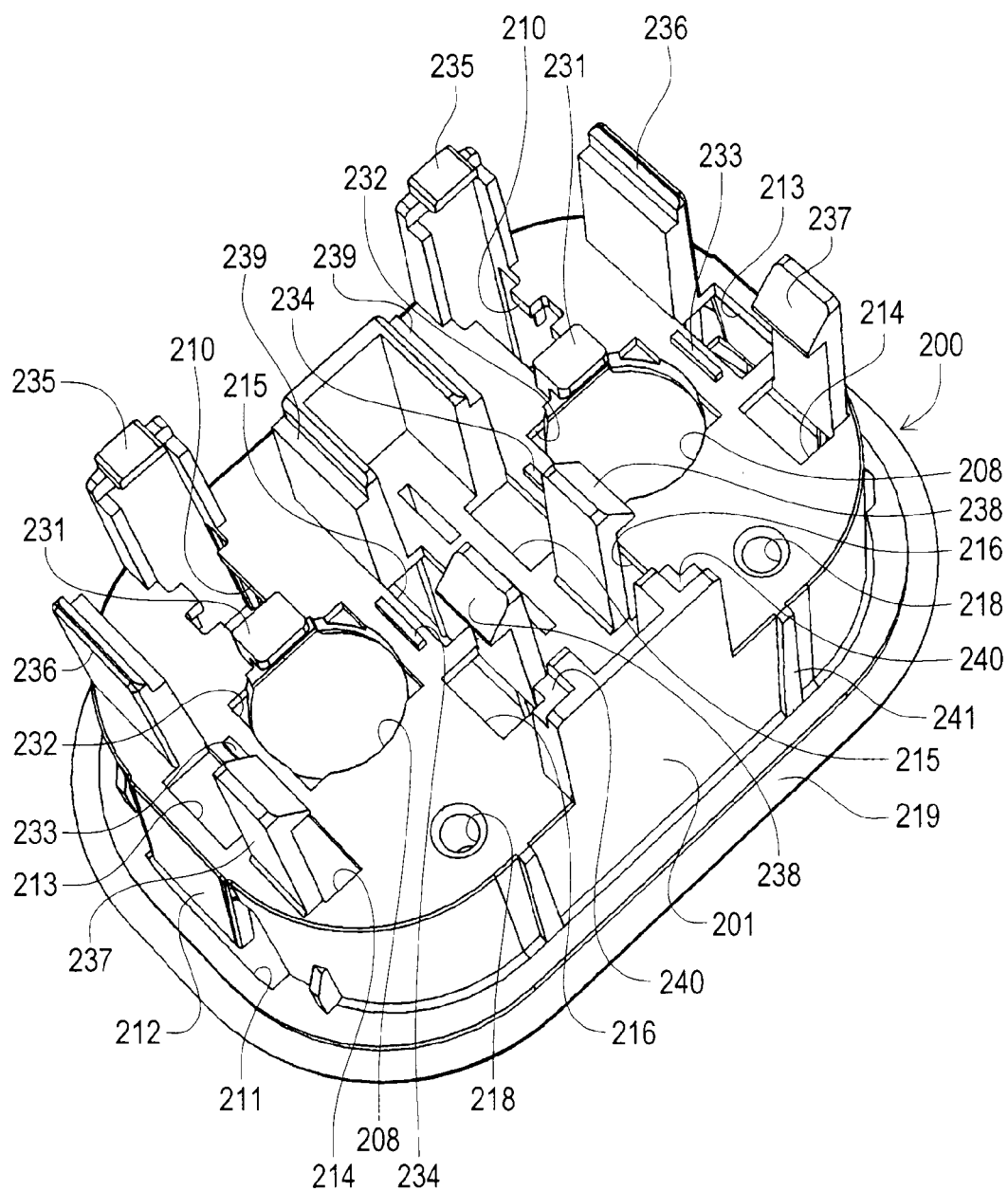
FIG. 9 is a perspective view of the button base constituting the push button when seen from bottom side.

A schematic configuration of the button base 200 will be described with reference to FIGS. 8 and 9. FIG. 8 is a perspective view of the button base 200 when seen from top side. FIG. 9 is a perspective view of the button base 200 when seen from bottom side. The button base 200 is formed of resin that allows optical penetration of visible light.

As shown in FIG. 8, the entirety of the top side of a holder 201 corresponds to an opening portion. The button base 200 is configured to include a projecting rim 219 around the outer periphery of the opening portion. The button base 200 is also configured to include a stepwise portion 205 around the inner periphery of the opening portion. In the button base 200, a pair of holder cells 203 are symmetrically defined by a partition wall 202 that is formed at the center of the holder 201.

Plural projecting strips 206 are formed on the side faces of the holder cells 203. On the side faces of the holder cells 203, a pair of side-face opening portions 211 are formed so as to face each other with reference to the longer side direction of the button base 200. Each of the side-face opening portions 211 is configured to include an engagement plate 212.

On the bottom of the holder cell 203, there is a round hole 208. Around edges of the round hole 208, there is formed a round projecting brim 207. On the bottom of the holder cell 203, there are formed a first opening portion 210, a second opening portion 213, a third opening portion 214, a fourth opening portion 215 and a fifth opening portion 216. On the bottom of the holder cell 203, there are also formed a round pedestal 209 and a column portion 217. In the center of the column portion 217, there is formed a fitting hole 218.

As will be described later, it is to be noted, in FIG. 8, there are depicted a first engagement portion 231, a second engagement portion 235, a side-face positioning projection portion 236, a first hook portion 237 and a second hook portion 238 all of which are formed on the bottom side of the holder 201.

On the other hand, as shown n FIG. 9, the button base 200 is configured to include the fitting hole 218 that penetrates to reach the bottom side of the holder 201. Near the periphery of the round hole 208, there are formed a pair of first positioning portions 233 and 234. Near the periphery of the round hole 208, there is formed a first engagement portion 231 at the other side of the round hole 208 with reference to the fitting hole 218. Furthermore, around the round hole 208, there are formed four of corner positioning portions 232.

A pair of first positioning projection portions 239 are formed adjoining to the forth opening portion 215 that locates in the middle of the holder 201 at the bottom side thereof. At the bottom side of the holder 201, a pair of second positioning projection portions 240 are formed in the middle of the side face of the holder 201 in parallel with the pair of the first positioning projection portions 239 with reference to shorter side direction of the button base 200. At the bottom side of the holder 201, a second engagement portion 235 is formed adjoining to the first opening portion 210. At the bottom side of the holder 201, a side-face positioning projection portion 236 is formed facing the first positioning projection portion 239 with reference to the longer side direction of the button base 200 and adjoining to the second opening portion 213. At the bottom side of the holder 201, a first hook portion 237 is formed facing the side-face positioning projection portion 236 with reference to the shorter side direction of the button base 200 and adjoining to the third opening portion 214. At the bottom side of the holder 201, a second hook portion 238 is formed facing the first hook portion 237 with reference to the longer side direction of the button base 200 and adjoining to the fifth opening portion 216.

Plural projecting strips 241 are formed on the side face of the holder 201. As already described, on the side face of the holder cell 203, the pair of side-face opening portions 211 are formed so as to face each other with reference to the longer side direction of the button base 200. The side-face opening portion 211 is configured to include an engagement plate 212. Further, as already described, the projecting rim 219 is formed around the outer periphery of the holder 201.

<Assemblage of Push Button>

Firstly, there will be described on attachment of the first mounting substrate 300 to the button base 200 by referring to FIGS. 8 and 9 as well as FIGS. 1 through 3. For the attachment of those, the first mounting substrate 300 shall get engaged with the first engagement portion 231 so that the LED 301 on the first mounting substrate 300 is placed in the round hole 208 of the holder 201. After that, the four corners on the bottom of the LED 301 for the first mounting substrate 300 shall get fitted with the four of corner positioning portion 232 so as to place the first mounting substrate 300 between the pair of the first positioning portions 233, 234. At this stage, the fitting hole 218 of the holder 201 and the fitting hole 302 of the first mounting substrate 300 overlap with each other. With this state, the fitting screw P is inserted in the fitting hole 218 of the holder 201 through the fitting hole 302 of the first mounting substrate 300. Thereby, attachment of the first mounting substrate 300 to the button base 200 is completed.

Figure 10:
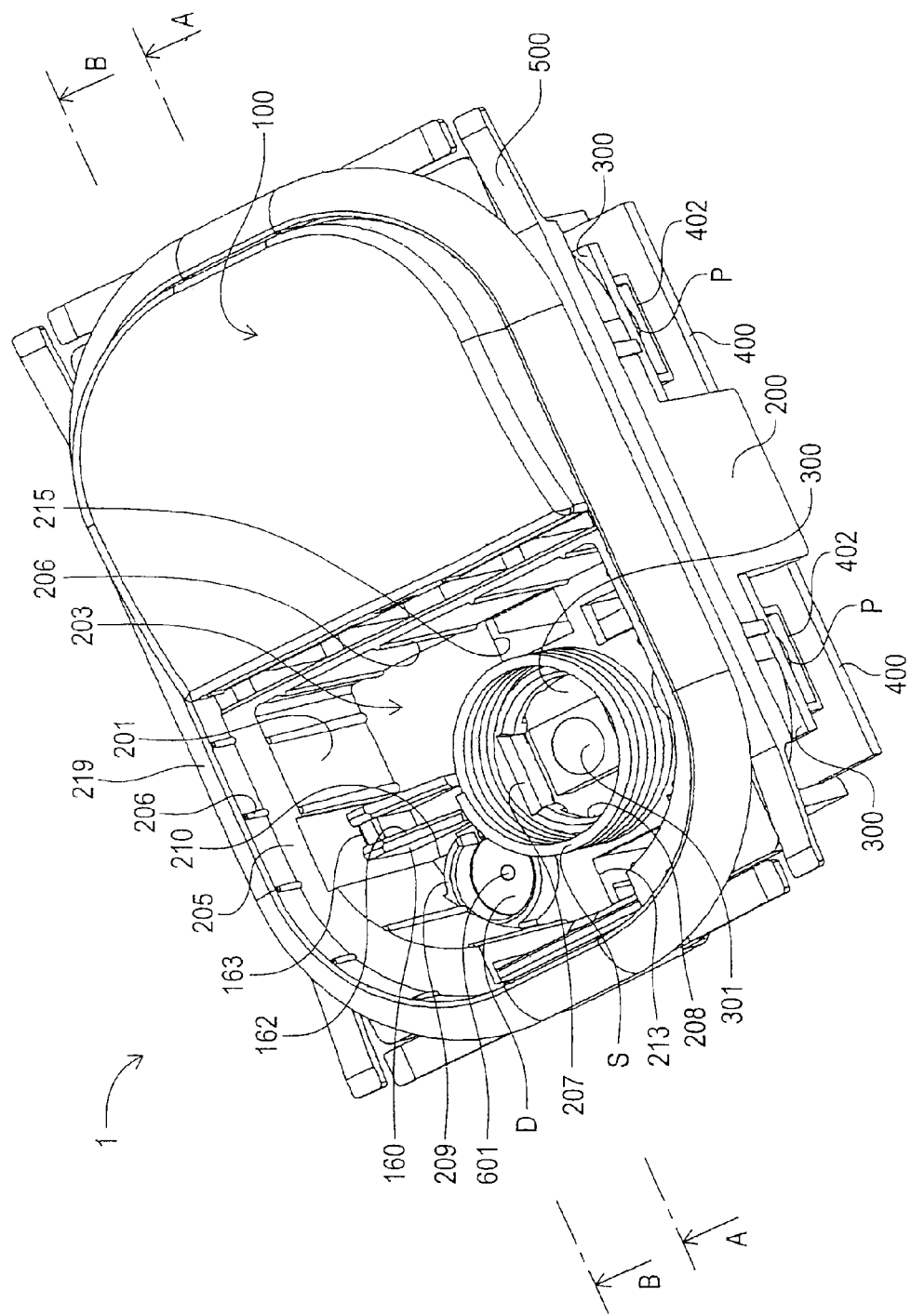
FIG. 10 is a perspective view of the push button when seen from top side wherein one of the depressing portions is omitted and the detection target piece coupled with the omitted depressing portion is visibly indicated.

When the first mounting substrate 300 is attached to the button base 200, as shown in FIG. 10 to be referred later, at the top side of the holder 201, there can be seen the LED 301 of the first mounting substrate 300 exposed from the round hole 208 of the holder 201.

Next, there will be described on attachment of the second mounting substrate 400 to the button base 200 by referring to FIGS. 8 and 9 as well as FIGS. 1 through 3. For the attachment of those, the second mounting substrate 400 shall get engaged with the second engagement portion 235 so that the photo sensor 401 of the second mounting substrate 400 is placed facing the first opening portion 210. After that, the second mounting substrate 400 is placed between the first positioning projection portion 239 and the side-face positioning projection portion 236. Further, the second mounting substrate 400 is pushed toward the holder 201 so as to get the second mounting substrate 400 engaged with the first hook portion 237 and the second hook portion 238. After that, one corner of the second mounting substrate 400 is fitted with the second positioning projection portion 240. Thereby, the attachment of the second mounting substrate 400 to the button base 200 is completed.

At the stage where the second mounting substrate 400 has been attached to the button base 200, the spacer 402 of the second mounting substrate 400 shall get in contact with the fitting screw P.

Next, there will be described on attachment of the button frame 500 to the button base 200 by referring to FIGS. 8 and 9 as well as FIGS. 1 through 3. For the attachment of those, the button frame 500 is fitted from the bottom side of the holder 201. After that, the button frame 500 is guided by the projecting strips 241 of the holder 201 so as to get in contact with the projecting rim 219 of the holder 201. At this stage, the button frame 500 is placed between the projecting rim 219 of the holder 201 and the engagement plate 212 (refer to FIG. 11 described later). Thereby, attachment of the button frame 500 to the button base 200 is completed.

Next, there will be described on the assemblage inside the button base 200. FIG. 10 is a perspective view of the push button 1 directed to the present embodiment when seen from top side wherein one of the depressing portions 100 is omitted and the detection target piece 160 coupled with the omitted depressing portion 100 is visibly indicated. The bottom end portion of the spring S shall get engaged with the round projecting brim 207 in the holder cell 203. Further, the metal dome D is fitted into the round pedestal 209 in the holder cell 203. At this stage, the metal dome D formed so as to be a dome-like metallic round plate is placed with the dome-like part upside. Thereby, the metal dome D is placed in a state that the round concave portion 601 formed on the center of the metallic round plate is put upside (refer to FIG. 12 described later).

From the round hole 208 that is the inner periphery for the round projecting brim 207 of the holder cell 203, the LED 301 of the first mounting substrate 300 is exposed. In FIG. 10, there are shown positional relation, when seen from one of the sides of button base 200, between the projecting rim 219 of the holder 201 and the button frame 500, between the fitting screw P and the first mounting substrate 300, the spacer 402 of the second mounting substrate 400 and the first mounting substrate 300.

Figure 11:
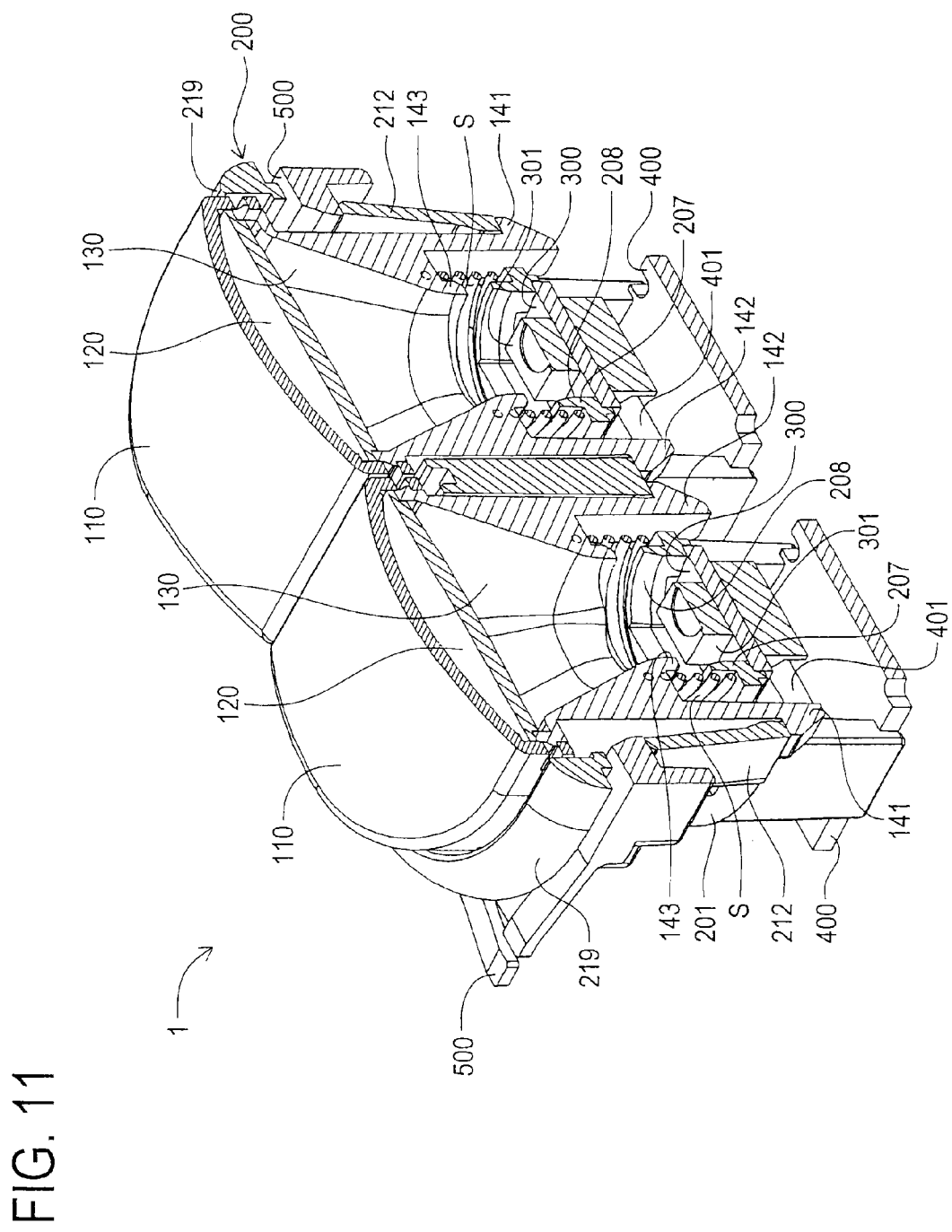
FIG. 11 is a cross sectional view of the push button when cut along longer-side directional center line A-A indicated in FIG. 10.
Figure 12:
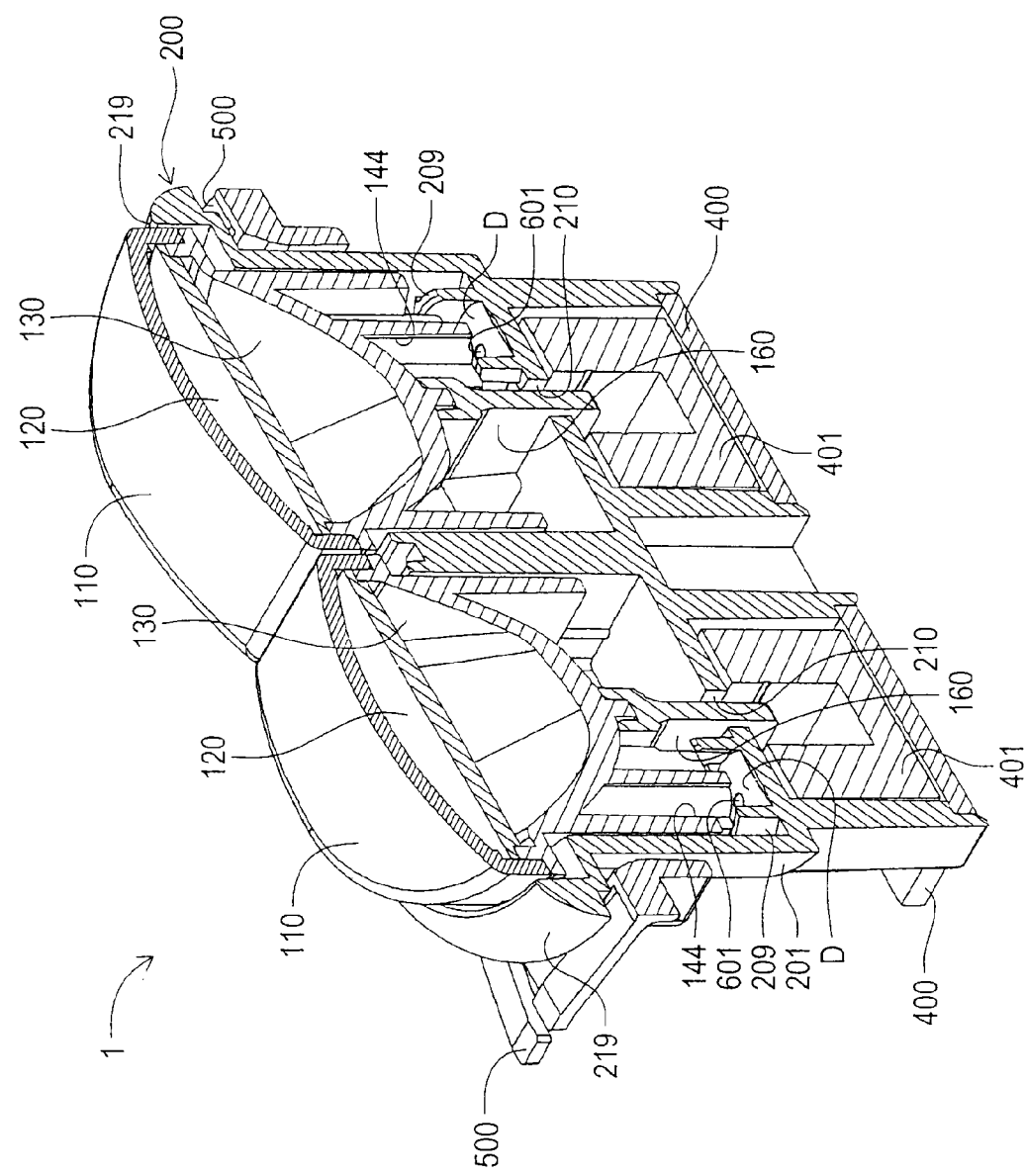
FIG. 12 is a cross sectional view of the push button when cut along longer side reference line B-B indicated in FIG. 10.

Next, there will be described on attachment of the depressing portion 100 to the button base 200 by referring to FIG. 10 as well as FIGS. 11 and 12. FIG. 11 is a cross sectional view of the push button 1 directed to the present embodiment when cut along longer side directional center line A-A (refer to FIG. 10 described above) for the button base 200. FIG. 12 is a cross sectional view of the push button 1 directed to the present embodiment when cut along longer side directional reference line B-B (refer to FIG. 10 described above) for the button base 200.

For the attachment of those, the depressing portion 100 is housed inside the holder cell 203. As shown in FIG. 11, in the state that the depressing portion 100 is housed inside the holder cell 203, the upper end of the spring S is fitted with the round projecting brim 143 of the head 130 that constitutes the depressing portion 100. Further, the first hook portion 141 and the second hook portion 142 both formed on the head 130 shall respectively get engaged with the second opening portion 213 and the fourth opening portion 215 both formed in the holder cell 203.

As shown in FIG. 12, in the state that the depressing portion 100 is housed inside the holder cell 203, the protruding portion 144 of the head 130 is placed above the metal dome D. Further as shown in FIG. 12, the detection target piece 160 attached to the head 130 is placed in the first opening portion 210 in the holder cell 203.

<Operational Steps of Push Button>

Here will be described on how a stroke of the depressed depressing portion 100 is secured with respect to the push button 1 directed to the present embodiment. It is to be noted that the depressing portion 100 is urged upward by the spring S. Thereby, the first hook portion 141 and the second hook portion 142 both formed on the head 130 constituting the depressing portion 100 shall respectively get engaged with the second opening portion 213 and the fourth opening portion 215 both formed in the holder cell 203. The engagement of those puts the depressing portion 100 at its home position.

When the depressing portion 100 is depressed, the spring S gets compressed. Consequently, the depressing portion 100 moves downward. At this moment, the depressing portion 100 moves downward by the guide of the projecting strips 206 inside the holder cell 203. After that, the projecting brim 132 of the head 130 gets in contact with the stepwise portion 205 in the holder cell 203. This state corresponds to the bottom dead center of the stroke with the depressing portion 100. On the other hand, when the depressing portion 100 is released from the depressed state, the spring S expands. Consequently, the depressing portion 100 moves upward. At this moment, the depressing portion 100 moves upward by the guide of the projecting strips 206 inside the holder cell 203. After that, the first hook portion 141 and the second hook portion 142 both formed on the head 130 shall respectively get engaged with the second opening portion 213 and the fourth opening portion 215 both formed in the holder cell 203, whereby the depressing portion 100 returns to the home position. This state corresponds to the top dead center of the stroke with the depressing portion 100.

<Function of Push Button>

When the depressing portion 100 is at the top dead center of the stroke (home position), the detection target piece 160 attached to the head 130 is placed in the first opening portion 210 inside the holder cell 203 at the position free from detection by the photo sensor 401 located below the first opening portion 210. When the stroke of the depressing portion 100 moves down from the top dead center (home position) by a predetermined distance to reach a certain position (termed as "switch point", hereinafter), the detection target piece 160 is moved downward in the first opening portion 210 and detected by the photo sensor 401. When the depressing portion 100 moves downward exceeding the predetermined distance, the detection target piece 160 is moved further downward and continuously detected by the photo sensor 401. In case the depressing portion 100 is moved upward from this state, the detection target piece 160 is continuously detected by the photo sensor 401 until the depressing portion 100 returns to the "switch point". Thus, the photo sensor 401 outputs a detection result signal concerning presence and absence of the detection target piece 160.

It is to be noted that when the depressed depressing portion 100 is at the bottom dead center of the stroke, the detection target piece 160 is at position free from a fear of collision with the photo sensor 401.

<Feeling of Push Button>

When the depressing portion 100 moves down from the top dead center of the stroke (home position) by the predetermined distance to reach a certain position of the stroke ("switch point"), the protruding portion 144 of the head 130 is moved. Along the movement of those, the round convex portion 145 of the protruding portion 144 gets fitted in the round concave portion 601 of the metal dome D and depresses the metal dome D. At this stage, the dome-like upper side of the metal dome D gets bent down, i.e., elastic deformation occurs to the metal dome D, and a click sound is generated. When the depressing portion 100 moves downward exceeding the predetermined distance, the protruding portion 144 of the head 130 is also moved further. Along this movement, the protruding portion 144 keeps depressing the metal dome D. Consequently, elastic deformation of the metal dome D is progressed.

The above such elastic deformation of the metal dome D does not occur when the depressing portion 100 is present between the top dead center and the "switch point" in the stroke but does occur when present between the "switch point" and the bottom dead center in the stroke.

In this connection, when the depressing portion 100 is present between the top dead center and the "switch point" in the stroke, the detection target piece 160 is not detected by the photo sensor 401, as already described in the above. Accordingly, while the detection target piece 160 is not detected by the photo sensor 401, only the load of the spring S works on the depressing portion 100. That is, only the load of the spring S is transmitted to a finger of a player who depresses the depressing portion 100 as the feeling of depression. On the other hand, when the depressing portion 100 is present between the "switch point" and the bottom dead center in the stroke, the detection target piece 160 is detected by the photo sensor 401, as already described in the above. Accordingly, while the detection target piece 160 is detected by the photo sensor 401, the load of the spring S and the load of the metal dome D integrally work on the depressing portion 100. That is, the load of the spring S and that of the metal dome D are simultaneously transmitted to the finger of the player who depresses the depressing portion 100 as the feeling of depression.

Figure 15:
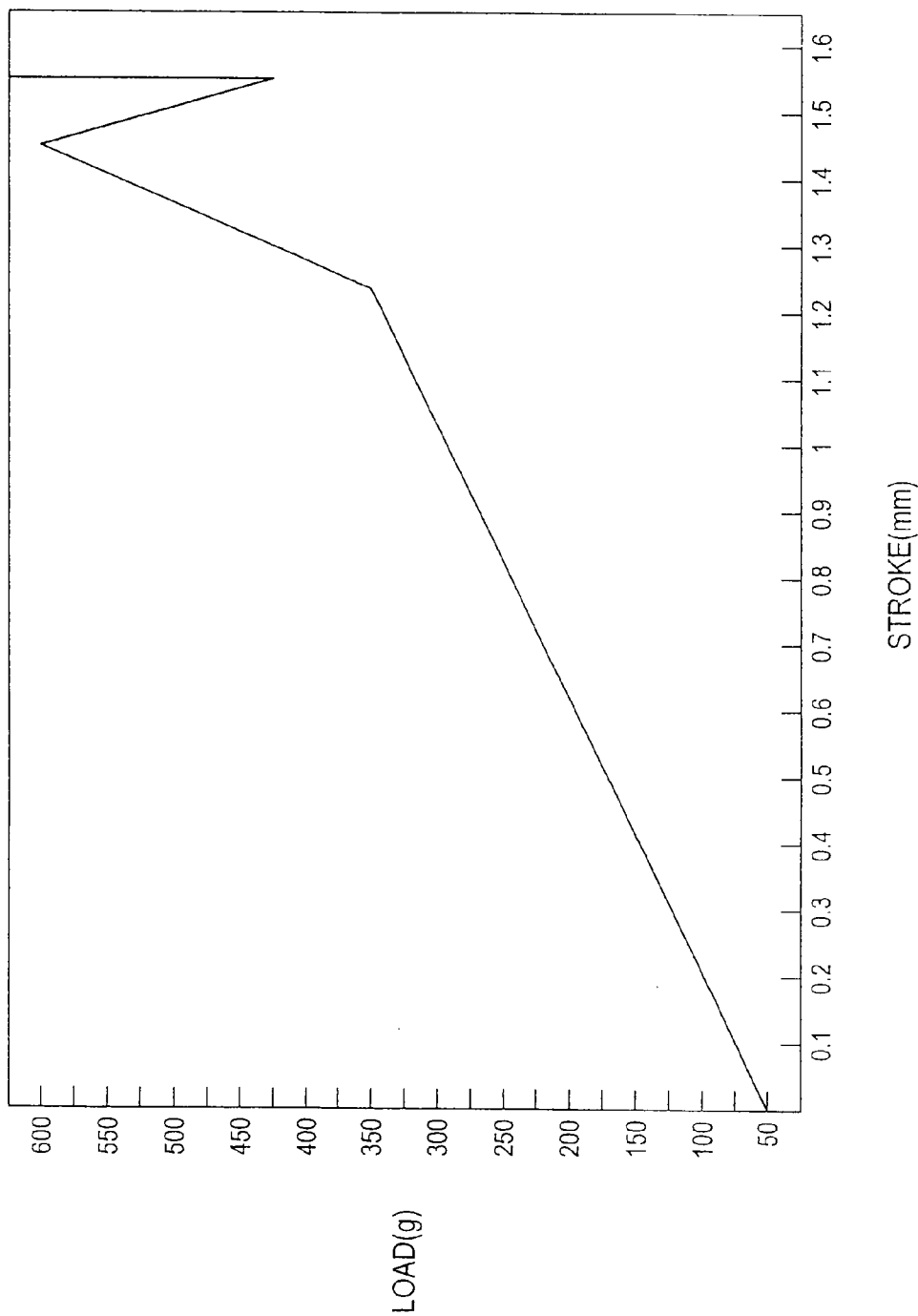
FIG. 15 is a view indicating an example of a result obtained with an experimental modeled push button with respect to relation between load working on the depressing portion and stroke thereof.

FIG. 15 is a view indicating an example of a result obtained with the push button 1 as experimental model with respect to relation between load working on the depressing portion 100 and stroke thereof. According to the experimental model of FIG. 15, 50 g of load from the spring S works on the depressing portion 100 when the depressing portion 100 is at the home position, i.e., when the depressing portion 100 takes 0 mm of the stroke. Only the load from the spring S works on the depressing portion 100 when the depressing portion 100 takes the stroke between 0 mm and approximately 1.2 mm. The load from the metal dome D and that from the spring S integrally work on the depressing portion 100 when the depressing portion 100 takes the stroke of approximately between 1.2 mm and 1.4 mm. That is, when the depressing portion 100 takes the stroke of approximately 1.4 mm, there occurs change of the balance between depression pressure needed for the player to depress the depressing portion 100 and reaction force (a sum of plural kinds of load working on the depressing portion 100) against the pressure.

The load from the metal dome D and that from the spring S integrally work on the depressing portion 100 when the depressing portion 100 takes the stroke of approximately between 1.4 mm and 1.5 mm. It is to be noted that the load from the spring S is generated owing to elastic deformation whereas the load from the metal dome D is generated owing to plastic deformation. According to the experimental model of FIG. 15, when the depressing portion 100 takes the stroke exceeding approximately 1.5 mm, the depressing portion 100 cannot move any more. Therefore, reaction force works on the depressing portion 100 against the depression force on the depressing portion 100.

In the experimental model of FIG. 15, there is defined approximately 1.4 mm of predetermined distance for the stroke of the depressing portion 100. The predetermined distance is from the top dead center of the stroke (home position) to the "switch point" of the stroke. The bottom dead center of the stroke for the depressing portion 100 is arranged approximately between 1.2 mm and 1.4 mm in the stroke.

<Attachment of Push Button>

As already described in the above, the push button 1 directed to the present embodiment is attached to the control panel 30 of the slot machine 10. Concerning the attachment of the push button 1, the button frame 500 is configured to include the single-step attachment structure. The single-step attachment structure corresponds to urging pieces formed on the four corners of the button frame 500. Therefore, even if thickness of the control panel 30 for the slot machine 10 is about 1 mm-2 mm, the single-step attachment structure of the button frame 500 allows attachment of the push button 1 directed to the present embodiment to the control panel 30 of the slot machine 10. Accordingly, in comparison with conventional fastening-with-nut-mannered attachment, attachment of the push button 1 described in the present embodiment is more convenient.

<Digest>

As described in the above, of the push button 1 directed to the present embodiment, the depressing portion 100 is urged upward by the spring S. In the case where the depressing portion 100 is depressed downward by the player opposing to the upward directional force in excess of the predetermined distance of the stroke, the detection target piece 160 poking out from the depressing portion 100 is detected by the photo sensor 401. That is, the detection target piece 160 poking out from the depressing portion 100 is detected by the photo sensor 401 when the depressing portion 100 is present at a position between the "switch point" and the bottom dead center of the stroke, the "switch point" is a point away downward from the top dead center of the stroke (home position) with the depressed depressing portion 100 by the predetermined distance.

Thus, according to the push button 1 directed to the present embodiment, the photo sensor 401 outputs a detection result signal concerning presence and absence of the detection target piece 160. An output signal from the photo sensor 401 is used for trigger switch between OFF and ON. Further, in case the depressing portion 100 is depressed with the excess of the predetermined distance, the metal dome D is pushed by the protruding portion 144 poking out from the depressing portion 100. That is, the metal dome D is pushed by the protruding portion 144 poking out from the depressing portion 100 when the depressing portion 100 is present at a position between the "switch point" and the bottom dead center in the stroke.

Accordingly, in the case where the depressing portion 100 is depressed by the player in a state that the depressing portion 100 is present at a point between the top dead center (home position) and the "switch point" in the stroke, only the urging force of the spring S works on the depressing portion 100. Thereby, there is established the balance relation between depression pressure needed for the player to take depression operation and reaction force against the depression pressure and the feeling of depression is given to the player through the depressing portion 100. On the other hand, when the depressing portion 100 is present between the "switch point" and the bottom dead center in the stroke, the urging force of the spring S and the elastic force of the metal dome D integrally work on the depressing portion 100. Thereby, there is established the balance relation between depression pressure needed for the player to take depression operation and reaction force against the depression pressure and the feeling of depression is given to the player through the depressing portion 100.

That is, the push button 1 directed to the present embodiment is a push button that uses an output signal from the photo sensor 401 as trigger switch between OFF and ON. Further, in the push button 1 directed to the present embodiment, when OFF and ON is switched, i.e., when the depressing portion 100 is at "switch point", there occurs change of the balance relation between depression pressure needed for the player to take depression operation and reaction force against the pressure (particularly, the feeling of depression for the player).

Further, different from the background prior art, by the time the stroke with the depressed depressing portion 100 reaches the bottom dead center, switch between OFF and ON is carried out and change of the balance relation between depression pressure need for the player to take depression operation and reaction force against the pressure occurs simultaneously. Accordingly, the above mechanism can obviate the situation that the depressing portion 100 reaches the bottom dead center of the stroke. Thereby, there can be reduced deterioration and damage owing to that the depressing portion 100 reaches the bottom dead center of the stroke.

The feeling of depression for the player is made different between switch OFF and switch ON. To be more specific, during the detection target piece 160 is not detected by the photo sensor 401, the depressing portion 100 is configured to be present at a point between the top dead center (home position) and the "switch point" in the stroke. Therefore, only the load from the spring S works on a finger of the player through the depressing portion 100. Accordingly, as the feeling of the depression, only the load from the spring S is transmitted to the finger of the player who depresses the depressing portion 100. On the other hand, during the detection target piece 160 s detected by the photo sensor 401, the depressing portion 100 is configured to be present at a point between the "switch point" and the bottom dead center in the stroke. Therefore, the load from the spring S and that from the metal dome D are integrally work on the finger of the player through the depressing portion 100. Accordingly, as the feeling of the depression, the load from the spring S and the load from the metal dome D are simultaneously transmitted to the finger of the player who depresses the depressing portion 100.

Accordingly, concerning the push button 1 directed to the present embodiment, in case material of the metal dome D is optionally selected, the feeling of depression for the player can possibly vary while the depressing portion 100 is depressed to be present between the "switch point" and the bottom dead center in the stroke with the excess of the predetermined distance. That is, by changing material of the metal dome D, the feeling of depression for the player during the detection target piece 160 is detected by the photo sensor 401 can be changed. For instance, instead of the metal dome D, use of a gradual dome shaped rubber round plate can bring the player significantly different feeling of depression.

By changing load characteristics of the spring S and the load characteristics of the metal dome D against the stroke with the depressed depressing portion 100, the feeling of depression for the player who depresses the depressing portion 100 can be changed, as well. To be more specific, with reference to the line graph of FIG. 15, by moving the line of the line graph in vertical direction (with respect to the range between 0 mm and about 1.4 mm in the stroke), the feeling of depression for the player who depresses the depressing portion 100 can be changed.

According to the push button 1 directed to the present embodiment, in a state that the depressing portion 100 is at the bottom dead center of the stroke, the projecting brim 132 of the head 130 constituting the depressing portion 100 gets in contact with the stepwise portion 205 in the holder cell 203 (so as to bump against the stepwise portion 205). Owing to the contact with (bump against) the stepwise portion 205, the depressing portion 100 is not allowed to move downward even if depressed further downward. Therefore, the detection target piece 160 cannot bump against the photo sensor 401. Also, in the state that the depressing portion 100 is at the bottom dead center of the stroke, the protruding portion 144 of the head 130 constituting the depressing portion 100 pushes the metal dome D in the holder cell 203 (so as to bump against the metal dome D). Owing to the push (bump) against the metal dome D, the depressing portion 100 is not allowed to move downward even if depressed further downward. Therefore, the detection target piece 160 cannot bump against the photo sensor 401. That is, as the mechanism to prevent the detection target piece 160 from bumping against the photo sensor 401, the push button 1 directed to the present embodiment is configured to include the structure allowing the projecting brim 132 of the head 130 to get in contact with the stepwise portion 205 in the holder cell 203 as well as the structure allowing the protruding portion 144 of the head 130 to push the metal dome D in the holder cell 203. Accordingly, the push button 1 directed to the present embodiment is configured to include double structures that prevent the detection target piece 160 from bumping against the photo sensor 401.

With respect to the push button 1 directed to the present embodiment, the metal dome D is a dome-like metallic round plate. In this regard, when depressing portion 100 is depressed down to reach the "switch point", the photo sensor 401 outputs a signal indicating detection of the detection target piece 160. When the output signal is used so as to trigger switch between OFF and ON, the protruding portion 144 poking out from the head 130 of the depressing portion 100 presses the dome-like metallic round plate (metal dome D). When depressed, the metal dome D gets elastically deformed and the dome-like top side thereof bends downward. Thereby, a click sound is generated. Although the push button 1 directed to the present embodiment is a push button that uses an output signal from the photo sensor 401 as trigger switch between OFF and ON, a click sound is generated at the time of switch between OFF and ON. Thus, the feeling of a click can be given to a finger of a player who depresses the push button 100. Therefore, the player can recognize his/her proper depression of the depressing portion 100.

As described in the above, when depressing portion 100 is depressed down to reach the "switch point", switch between OFF and ON is carried out. At this moment of depression, the round convex portion 145 of the protruding portion 144 gets fitted into and gets in contact with the round concave portion 601 of the metal dome D that is a dome-like metallic round plate. Therefore, this mechanism surely gets the dome-like metallic round plate (metal dome D) elastically deformed and bent downward. Although the push button 1 directed to the present embodiment is a push button that uses an output signal from the photo sensor 401 as trigger switch between OFF and ON, a click sound is generated surely at the time of switch between OFF and ON. Thus, the feeling of a click can be given to a finger of a player who depresses the push button 100. Therefore, the player can recognize his/her proper depression of the depressing portion 100 surely.

In case the slot machine 10 employing the push button 1 of the present embodiment is installed in a casino or such like facility, there may occur depending on game progress with the slot machine 10 that a player in excitement with the game depresses the depressing portion 100 to reach the bottom dead center of the stroke with his/her all force. In fact, as is case for the push button 1 directed to the present embodiment, a click sound is generated when the depressing portion 100 is depressed against the urging force of the spring S and moved down to the "switch point". Thereby, the feeling of a click can be given to a finger of a player who depresses the push button 100. Further, when the depressing portion 100 is further depressed down so as to be present at a point between the "switch point" and the bottom dead center in the stroke, the urging force of the spring S and the elastic force of the metal dome D integrally work on a finger of the player through the depressing portion 100. Thereby, in comparison with the stage that the depressing portion 100 is present between the top dead center (home position) and the "switch point" in the stroke, balance relation between depression pressure needed for the switch operation and reaction force against the depression pressure varies. Accordingly, the push button 1 directed to the present embodiment can make the player recognize that the depressing portion 100 has been depressed down to reach the "switch point" before depression of the depressing portion 100 reaches the bottom dead center of the stroke. Accordingly, the above mechanism can obviate the situation that a player in excitement depresses the depressing portion 100 down to the bottom dead center of the stroke with his/her all force in a rough manner. Therefore, there can be reduced deterioration and damage owing to that the depressing portion 100 is depressed down to reach the bottom dead center of the stroke with player's all force.

With respect to the push button 1 directed to the present embodiment, at least the outside cover 110, the inner cover 120 and the head 130 that constitute the depressing portion 100 are formed of resin that allows optical penetration of visible light. Accordingly, light of the LED 301 mounted on the first mounting substrate 300 penetrates the depressing portion 100 through the round hole 208 of the holder 201. Thereby, the depressing portion 100 can emit light from the inside owing to the LED 301. On the other hand, the detection target piece 160 is formed of resin that blocks visible light. Accordingly, with respect to the push button 1 directed to the present embodiment, even in a state that the depressing portion 100 emits light from the inside owing to the LED 301, the photo sensor 401 is configured to output a detection signal concerning presence and absence of the detection target piece 160 without an error. Thereby, the push button function by employing the above such photo sensor 401 (i.e., the OFF-ON switch function by the photo sensor 401) can be implemented.

The push button 1 directed to the present embodiment encompasses a push button as claimed any one of claim 1 through claim 3 wherein the push button further comprises a lighting portion that emits visible light to the depressing portion, material of the depressing portion is made of light guiding material and the detection target portion is made of opaque material.

<Others>

For instance, the push button 1 directed to the present embodiment employs two-way type push buttons wherein two depressing portions 100 adjoin to each other and integrally constitute a push button. However, only one of the two depressing portions 100 may be made effective. Even in the case of the above such push button that has integrated two depressing portions but only one of them is made effective, the push button can be attached to the control panel 30 of the slot machine 10 via the single-step attachment structure of the button frame 500, in similar to the case of the push button of which two depressing portions are made effective. Since it is not required to design and make a different control panel 30 depending on specification difference of push buttons, manufacturing costs can be reduced.

The push button directed to the present invention may be configure to be a one-way type push button that has only one depressing portion 100.

In case the detection target piece 160 is formed of resin that allows optical penetration of visible light, coating material that blocks visible light may be applied thereto.

The push button 1 directed to the present embodiment is described as installed in the control panel 30 of the slot machine 10, however it may be used for another types of gaming machines such as pachi-slot machines, pachinko machines (Japanese upright pinball gaming machines) etc. and game controllers. Further, the push button 1 directed to the present embodiment may be used for various things such as keyboards for personal computers etc., mobile terminal devices, household electrical appliances, audio visual equipment, fixed-line phones, mobile phones, calculators, elevators, remote controllers etc.

Although the embodiments of the present invention were described above, they were just illustrations of specific examples, and hence do not particularly restrict the present invention. A specific configuration of each step and the like is appropriately changeable in terms of design. Further, the effects described in the embodiments of the present invention are just recitations of the most suitable effects generated from the present invention. The effects of the present invention are thus not limited to those described in the embodiments of the present invention.

Further, the foregoing detailed descriptions centered the characteristic parts of the present invention in order to facilitate understanding of the present invention. The present invention is not limited to the embodiments in the foregoing specific descriptions but applicable to other embodiments with a variety of application ranges. Further, terms and phrases in the present specification were used not for restricting interpretation of the present invention but for precisely describing the present invention. It is considered easy for the skilled in the art to conceive other configurations, systems, methods and the like included in the concept of the present invention from the concept of the invention described in the specification. Therefore, it should be considered that recitations of the claims include uniform configurations in a range not departing from the range of technical principles of the present invention. Moreover, an object of the abstract is to enable a patent office, a general public institution, an engineer belonging to the technical field who is unfamiliar with patent, technical jargon or legal jargon, and the like, to smoothly determine technical contents and an essence of the present application with simple investigation. Accordingly, the abstract is not intended to restrict the scope of the invention which should be evaluated by recitations of the claims. Furthermore, for thorough understanding of an object of the present invention and an effect specific to the present invention, it is desired to make interpretation in full consideration of documents already disclosed and the like.

The foregoing detailed descriptions include processing executed on a computer. Explanations and expressions above are described with the aim of being most efficiently understood by the skilled person in the art. In the specification, each step for use in deriving one result should be understood as the self-consistent processing. Further, in each step, transmission/reception, recording or the like of an electrical or magnetic signal is performed. While such a signal is expressed by using a bit, a value, a symbol, a letter, a term, a number or the like in processing of each step, it should be noted that those are used simply for the sake of convenience in description. While there are cases where processing in each step may be described using an expression in common with that of action of a human, processing described in the specification is essentially executed by a variety of devices. Further, other configurations requested for performing each step should become apparent from the above descriptions.

What is Claimed as New and Desired to be Secured by Letters Patent of the United States is:

1. A push button comprising:
    a depressing portion;
    an urging portion that urges the depressing portion in a first direction;
    a detection target portion that pokes out from the depressing portion in a second direction that is opposite to the first direction;
    a protruding portion that pokes out from the depressing portion in the second direction;
    a photo sensor that detects the detection target portion when the depressing portion is depressed in the second direction by a predetermined distance or longer; and
    an elastic portion that gets elastically deformed when the depressing portion is depressed in the second direction by the predetermined distance or longer, wherein
    the elastic portion is a dome-shaped metallic round plate;
    a round convex portion is arranged in the protruding portion;
    a round concave portion is arranged in the elastic portion; and,
    the round convex portion contacts the round concave portion when the elastic portion is pushed by the protruding portion.

* * * * *